US006653219B2

(12) United States Patent
Fukuyama

(10) Patent No.: US 6,653,219 B2
(45) Date of Patent: Nov. 25, 2003

(54) METHOD OF MANUFACTURING BUMP ELECTRODES AND A METHOD OF MANUFACTURING A SEMICONDUCTOR DEVICE

(75) Inventor: Satoru Fukuyama, Ome (JP)

(73) Assignee: Hitachi, Ltd., Tokyo (JP)

( * ) Notice: Subject to any disclaimer, the term of this patent is extended or adjusted under 35 U.S.C. 154(b) by 144 days.

(21) Appl. No.: 10/004,875

(22) Filed: Dec. 7, 2001

(65) Prior Publication Data

US 2002/0086515 A1 Jul. 4, 2002

Related U.S. Application Data

(62) Division of application No. 09/462,795, filed as application No. PCT/JP97/02855 on Aug. 19, 1997, now Pat. No. 6,335,271.

(51) Int. Cl.[7] ............................................. H01L 21/44
(52) U.S. Cl. ..................................................... 438/616
(58) Field of Search ................................ 438/106, 119, 438/612, 613, 615, 616, 660; 29/842, 843

(56) References Cited

U.S. PATENT DOCUMENTS

| 5,829,668 A | 11/1998 | George et al. |
| 6,025,258 A | 2/2000 | Ochiai et al. |
| 6,319,810 B1 * | 11/2001 | Ochiai et al. ............... 438/616 |

FOREIGN PATENT DOCUMENTS

| JP | 4-14834 | 1/1992 |
| JP | 4-22132 | 1/1992 |
| JP | 4-263433 | 9/1992 |
| JP | 5-129374 | 5/1993 |
| JP | 6-275628 | 9/1994 |
| JP | 7-249631 | 9/1995 |
| JP | 7-263448 | 10/1995 |
| JP | 7-302972 | 11/1995 |
| JP | 7-307341 | 11/1995 |
| JP | 8-330719 | 12/1996 |
| JP | 8-340001 | 12/1996 |
| JP | 9-246419 | 9/1997 |

OTHER PUBLICATIONS

M. Muraishi et al, "A Study of High Density, High Temperature Solder Bump", Materials for 1994 Autumn Meeting of the Institute of Electronics, Information and Communication Engineers, 1994, p. 28.

Mishina et al, "Microbump Formation Technology", Materials for Seminars on Practical Application of Fine Pitch SMT, Nov. 1996, pp. 6–1 to 11.

Brutovsky et al, Electronic Packagaing & Production, vol. 37, No. 7, pp. 57, 58, 60 and 62.

* cited by examiner

Primary Examiner—Evan Pert
(74) Attorney, Agent, or Firm—Mattingly, Stanger & Malur, P.C.

(57) ABSTRACT

In a method of manufacturing bump electrodes, a solder paste material is filled in concave parts provided on one surface of a jig for forming bumps, and the solder paste material is melted under the condition in that the concave parts of the jig for forming bumps face electrode pads provided on one surface of a substrate (a semiconductor chip or a circuit board), to form bump electrodes on the electrode pads of the substrate, whereby the size of the bump electrodes formed on electrode pads can be uniform. Furthermore, a short circuit among the electrode pads of the substrate (a semiconductor chip or a circuit board) can be prevented. Furthermore, the yield in a production process of a semiconductor device having bump electrodes can be increased.

7 Claims, 16 Drawing Sheets

METHOD OF MANUFACTURING BUMP ELECTRODES AND A METHOD OF MANUFACTURING A SEMICONDUCTOR DEVICE

This is a divisional application of U.S. Ser. No. 09/462,795, filed Jan. 13, 2000, which is a 371 of PCT/JP97/02855, filed Aug. 19, 1997.

TECHNICAL FIELD

The present invention relates to a technique for manufacturing bump electrodes on electrode pads.

BACKGROUND OF THE INVENTION

As a technique for manufacturing bump electrodes on electrode pads of a semiconductor chip or electrode pads of a circuit board, a technique for manufacturing bumps comprising forming bump electrodes by using a solder paste material in a semi-solid state formed by kneading solder particles and a flux is described, for example, in Japanese Patent Laid-Open No. 263448/1995 and Japanese Patent Laid-Open No. 330719/1996.

The technique for manufacturing bumps (A) described in Japanese Patent Laid-Open No. 263448/1995 is as follows:

Firstly, a screen mask comprising a glass material is fitted on (attached to) a flat plate. The screen mask has openings (through holes), in which a solder paste material for forming bump electrodes is filled. A solder paste material is then filled in the openings of the screen mask with a squeegee. The screen mask is then removed from the flat plate along with the solder paste material filled in the openings of the screen mask. The screen mask is then fitted on a semiconductor chip or a circuit board (hereinafter, a semiconductor chip and a circuit board are called in general a substrate) under the condition in that electrode pads of a semiconductor chip or electrode pads of a circuit board face the openings of the screen mask. A heat treatment is then conducted to melt the solder paste material filled in the openings of the screen mask, so as to form bump electrodes. According to the manner, bump electrodes are formed on the electrode pads of the substrate.

The technique for manufacturing bumps (B) described in Japanese Patent Laid-Open No. 330719/1996 is as follows:

Firstly, a screen mask comprising a stainless steel material is fitted on (attached to) a substrate. The fitting of the screen mask is conducted under the condition in that electrode pads of the substrate face openings (through holes) of the screen mask. A solder paste material is then filled in the openings of the screen mask with a squeegee. The screen mask is then removed from the substrate in such a manner that the solder paste material filled in the openings of the screen mask remains on the electrode pads of the substrate. A heat treatment is then conducted to melt the solder paste material on the electrode pads of the substrate, so as to form bump electrodes. According to the manner, bump electrodes are formed on the electrode pads of the substrate.

Because the composition of the solder paste material can be freely selected in the technique for manufacturing bumps (A) and the technique for manufacturing bumps (B), bump electrodes having a low melting point composition, specifically bump electrodes having a composition comprising 37% by weight of Pb (lead) and 63% by weight of Sn (tin), can be easily manufactured, in comparison to a technique for manufacturing bumps comprising forming bump electrodes using a vapor deposition method. Furthermore, because the amount of the solder paste material can be increased by changing the thickness of the screen mask and the area of the openings, bump electrodes having a large height, specifically bump electrodes having a height of 40 µm or more, can be easily manufactured, in comparison to a technique for manufacturing bumps comprising forming bump electrodes using a plating method. Furthermore, because bump electrodes can be formed at once on the surfaces of the plural electrode pads formed on one surface of the substrate, the cost of manufacturing bump electrodes can be reduced, in comparison to a technique for manufacturing bumps comprising forming bump electrodes using a ball bonding method. Furthermore, because bump electrodes are formed by melting the solder paste material formed on the surfaces of the plural electrode pads, respective bump electrodes can be certainly formed on the plural electrode pads, in comparison to a technique for manufacturing bumps comprising forming bump electrodes using a ball supplying method. In the ball supplying method, because solder balls previously formed are supplied to the surfaces of the electrode pads with a suction jig, supply shortage is liable to occur.

The technique for manufacturing bumps comprising forming bump electrodes using a vapor deposition method is described, for example, in Japanese Patent Laid-Open No. 275628/1994.

Furthermore, the technique for manufacturing bumps comprising forming bump electrodes using a plating method is described, for example, in Mitsumasa Muraishi et al, "A Study of High Density High Temperature Solder Bump", Materials for 1994 Autumn Meeting of The Institute of Electronics, Information and Communication Engineers, p. 28.

Furthermore, the technique for manufacturing bumps comprising forming bump electrodes using a ball bonding method is described, for example, in Mishina et al, "Microbump Formation Technology", Materials for Seminars on Practical Application of Fine Pitch SMT on November of 1996, p. 6–1 to 11.

Furthermore, the technique for manufacturing bumps comprising forming bump electrodes using a ball supplying method is described, for example, in Japanese Patent Laid-Open No. 129374/1993.

In the technique for manufacturing bumps comprising forming bump electrodes using a solder paste material, the size of the bump electrodes can be freely set by measuring the amount of the solder paste material formed on the electrode pads of the substrate with the thickness of the screen mask and the area of the openings. However, in the invention, the following problems have been found as a result of investigations of the technique for manufacturing bumps.

(1) In the technique for manufacturing bumps (A), because the screen mask is removed from the flat plate along with the solder paste material filled in the openings of the screen mask, a part of the solder paste material filled in the openings of the screen mask is left on the flat plate upon removing the screen mask from the flat plate. Accordingly, the amount of the solder paste material in the openings of the screen mask removed from the flat plate fluctuates, and thus the size of the bump electrodes becomes non-uniform. In the case where the size of the bump electrodes becomes non-uniform, the height of the bump electrodes fluctuates, and when, for example, a semiconductor chip is mounted on a circuit board through plural bump electrodes, connection failure occurs, in which the electrode pad of the circuit board is not electrically connected to the electrode pad of the semiconductor chip.

Furthermore, in the technique for manufacturing bumps (A), because the screen mask is fitted to the flat plate, and then the solder paste material is filled in the openings of the screen mask with a squeegee, the solder paste material leaks between the screen mask and the flat plate from the openings of the screen mask upon filling the solder paste material in the openings of the screen mask, and thus excessive solder paste material is attached on the fitted surface of the screen mask removed from the flat plate. The excessive solder paste material is transferred to spaces among the electrode pads of the substrate upon fitting the screen mask to the substrate. Therefore, when the solder paste material filled in the openings of the screen mask is melted to form bump electrodes, an electrically conductive foreign matter is formed among the electrode pads of the substrate from the excessive solder paste material, and thus a short circuit is formed among the electrode pads of the substrate (a semiconductor chip or a circuit board). The short circuit among the electrode pads of the substrate becomes significant when the interval of the arrangement of the electrode pads is narrow.

(2) In the technique for manufacturing bumps (B), because the screen mask is removed from the substrate in such a manner that the solder paste material filled in the openings of the screen mask remains on the electrode pads of the substrate, a part of the solder paste material is left in the openings of the screen mask upon removing the screen mask from the substrate. Therefore, the amount of the solder paste material remaining on the electrode pads of the substrate fluctuates, and thus the size of the bump electrodes becomes non-uniform as similar to the technique for manufacturing bumps (A).

Furthermore, in the technique for manufacturing bumps (B), because the screen mask is fitted to the substrate, and then the solder paste material is filled in the openings of the screen mask with a squeegee, the solder paste material leaks between the screen mask and the substrate from the openings of the screen mask upon filling the solder paste material in the openings of the screen mask, and thus excessive solder paste material remains among the electrode pads of the substrate. Therefore, when the solder paste material formed on the electrode pads of the substrate is melted to form bump electrodes, an electrically conductive foreign matter is formed among the electrode pads of the substrate from the excessive solder paste material, and thus a short circuit is formed among the electrode pads of the substrate (a semiconductor chip or a circuit board), as similar to the technique for manufacturing bumps (A).

An object of the invention is to provide a technique in that size of bump electrodes formed on electrode pads can be uniform.

Another object of the invention is to provide a technique in that a short circuit among electrode pads of a substrate (a semiconductor chip or a circuit board) can be prevented.

The above-described and other objects and novel features of the invention will be apparent from the description of the present specification and the attached drawings.

DISCLOSURE OF THE INVENTION

The summary of the representative embodiment of the inventions disclosed in the present application will be briefly described as follows:

In a method of manufacturing bump electrodes, a solder paste material is filled in concave parts formed on one surface of a jig for forming bumps, and the solder paste material is melted under the condition in that the concave parts of the jig for forming bumps face electrode pads provided on one surface of a substrate (a semiconductor chip or a circuit board), so as to form bump electrodes on the electrode pads of the substrate. The jig for forming bumps is made of a material having a poor wettability with the solder paste material, and the electrode pads are made of a material having a good wettability with the solder paste material. Plurality of the concave parts of the jig for forming bumps are formed in the form of a matrix.

According to the means described above, because the solder paste material filled in the concave parts of the jig for forming bumps is melted to form bump electrodes on the electrode pads of the substrate, the amount of the solder paste material can be constant, and the size of the bump electrodes formed on the electrode pads of the substrate can be uniform.

Furthermore, because the solder paste material filled in the concave parts of the jig for forming bumps does not leak between the jig for forming bumps and the substrate, an electrically conductive foreign matter formed from the leaking excessive solder paste material can be eliminated, and a short circuit among the electrode pads of the substrate can be prevented.

BEST MODE FOR CARRYING OUT THE INVENTION

The constitution of the invention will be described along with embodiments.

In all the figures describing the embodiments, the same symbols are attached to the components having the same functions, and repeating descriptions are omitted.

Figure 1:
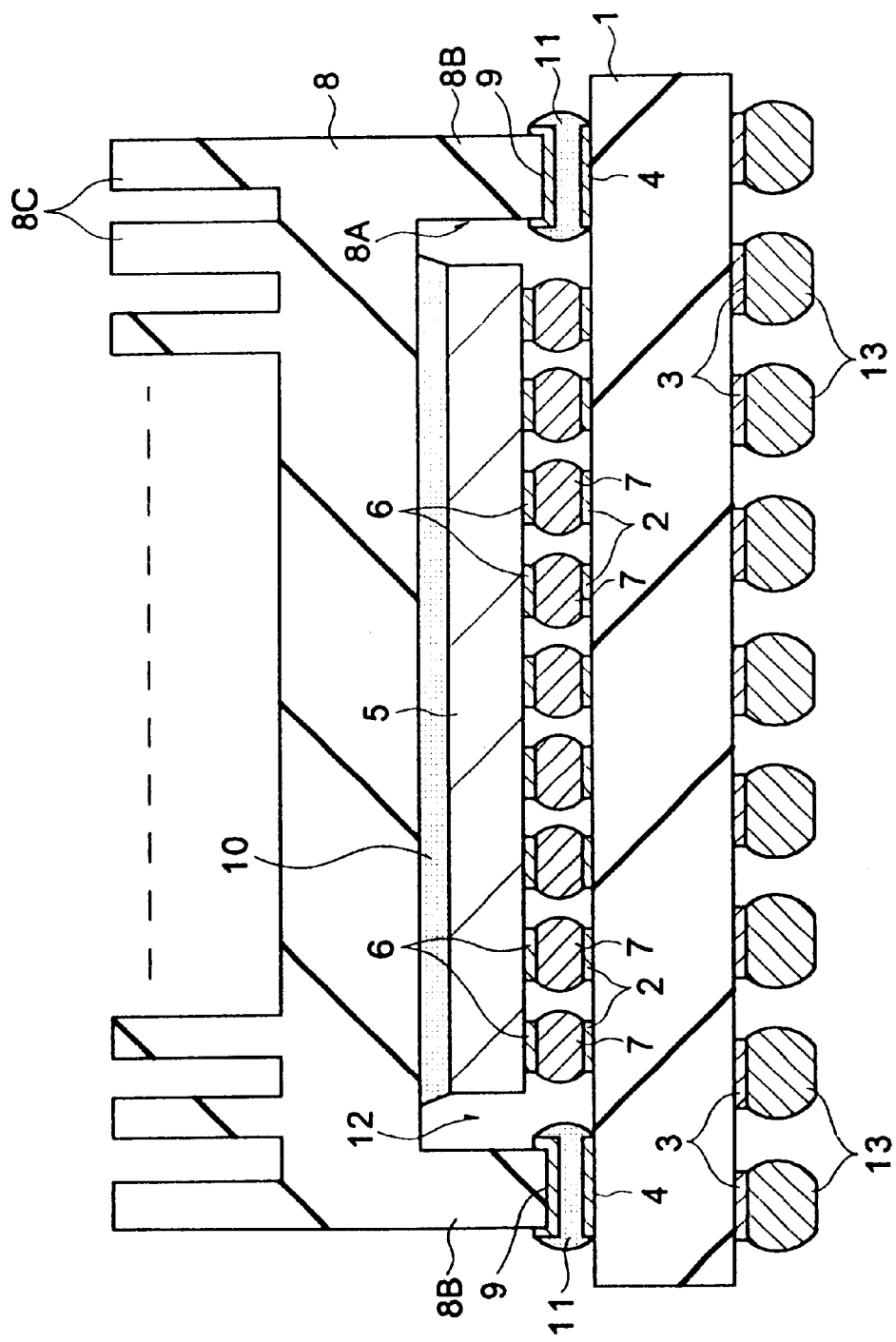
FIG. 1 is a cross sectional view of a semiconductor device as one embodiment of the invention.

FIG. 1 is a cross sectional view showing a summarized constitution of a semiconductor device as one embodiment of the invention.

As shown in FIG. 1, in the semiconductor device, a semiconductor chip 5 is mounted on a chip mounting surface of a circuit board 1 in a face down mode, and the semiconductor chip 5 is sealed with a sealing cap 8. The semiconductor chip 5 is sealed airtightly in a cavity 12 formed by a circuit board 1 and the sealing cap 8.

The circuit board 1 is constituted, for example, with a multilayer circuit structure, in which plural substrates comprising mullite are accumulated and laminated. Plural electrode pads 2 are provided on a chip-mounting surface of the circuit board 1, and plural electrode pads 3 are formed on the reverse surface opposite to the chip-mounting surface of the circuit board 1. The electrode pads 2 and the electrode pads 3 are electrically connected to each other through wiring of the circuit board 1.

On the reverse surface of the circuit board 1, plural bump electrodes 13 are provided as external terminals. The plural bump electrodes 13 each are fixed to the plural electrode pads 3 provided on the reverse surface of the circuit board 1, and electrically and mechanically connected thereto. As the bump electrodes 13, a bump electrode comprising a solder material having a composition comprising 97% by weight of Sn and 3% by weight of Ag (silver) is used, for example. The bump electrodes 13 in this case have a melting point of about 240° C. In this embodiment, the plan shape of the circuit board 1 is not limited to the figure, and for example, it has a square shape. The plural electrode pads 2 and the plural electrode pads 3 are not limited to the figure, and for example, they are arranged in a matrix form.

The bump electrode 13 has a spherical shape, the tips of which collapse.

The semiconductor chip 5 is not limited to the figure, and for example, it has a structure in that an insulating layer and a wiring layer each are accumulated on a semiconductor substrate comprising a single crystal silicon. In the semiconductor chip 5, a logic circuit system, a memory circuit system or a mixed circuit system comprising them is mounted. Plural electrode pads 6 are provided on a circuit-forming surface of the semiconductor chip 5. The plural electrode pads 6 each are electrically connected to the circuit system provided on the semiconductor chip 5. In this embodiment, the plan shape of the semiconductor chip 5 is not limited to the figure, and for example, it has a square shape. The plural electrode pads 6 are not limited to the figure, and for example, they are arranged in a matrix form.

Plural bump electrodes 7 are formed between the chip-mounting surface of the circuit board 1 and the circuit-forming surface (the lower surface in FIG. 1) of the semiconductor chip 5. The plural bump electrodes 7 each are fixed to the plural electrode pads 6 provided on the circuit-forming surface of the semiconductor chip 5, and electrically and mechanically connected thereto. The plural bump electrodes 7 each are fixed to the plural electrode pads 2 provided on the chip-mounting surface of the circuit board 1, and electrically and mechanically connected thereto. As the bump electrodes 7, a bump electrode comprising a solder material having a composition comprising 98.2% by weight of Pb and 1.8% by weight of Sn is used, for example. The bump electrodes 7 in this case have a melting point of about from 320 to 325° C.

The sealing cap 8 has a constitution mainly comprising a container part 8A for containing the semiconductor chip 5, and leg parts 8B and radiating fins 8C provided around the container part 8A. The sealing cap 8 is made of, for example, aluminum nitride (AlN) having a good heat conductivity.

The leg parts 8B of the sealing cap 8 are fixed to a sealing part on the chip-mounting surface of the circuit board 1 through a sealing material 11. As the sealing material 11, a solder material having a composition comprising 80% by weight of Au (gold) and 20% by weight of Sn is used, for example. The sealing material 11 in this case has a melting point of about 280° C.

A metallized layer 9 having a high wettability with the solder material 11 is formed on the leg parts 8B of the sealing cap 8, and a metallized layer 4 having a high wettability with the solder material 11 is formed on the sealing part of the circuit board 1.

The reverse surface of the semiconductor chip 5 opposite to the circuit-forming surface is connected to an inner wall surface of the sealing cap 8 facing the reverse surface of the semiconductor chip 5, through a heat conductive material 10. As the heat conductive material 10, a solder material having a composition comprising 37% by weight of Pb and 63% by weight of Sn is used, for example. The heat conductive material 10 in this case has a melting point of about 183° C.

On the reverse surface of the semiconductor chip 5, a metallized layer, not shown in the figure, having a high wettability with the heat conductive material 10 is formed. On the inner wall surface of the sealing cap 8 facing the reverse surface of the semiconductor chip 5, a metallized layer, not shown in the figure, having a high wettability with the heat conductive material 10 is formed.

In the circuit board 1, the electrode pad 3 has a circular plan shape. The pad diameter of the electrode pad 3 is set at about 150 μm, for example, and the arrangement interval thereof is set at about 300 μm, for example. The electrode pad 2 has a circular plan shape. The pad diameter of the electrode pad 2 is set at about 150 μm, for example, and the arrangement interval thereof is set at about 300 μm, for example.

In the semiconductor chip 5, the electrode pad 6 has a circular plan shape. The pad diameter of the electrode pad 6 is set at the similar value as the pad diameter of the electrode pad 2, and the arrangement interval thereof is also set at the similar value as the arrangement interval of the electrode pad 2.

Figure 2:
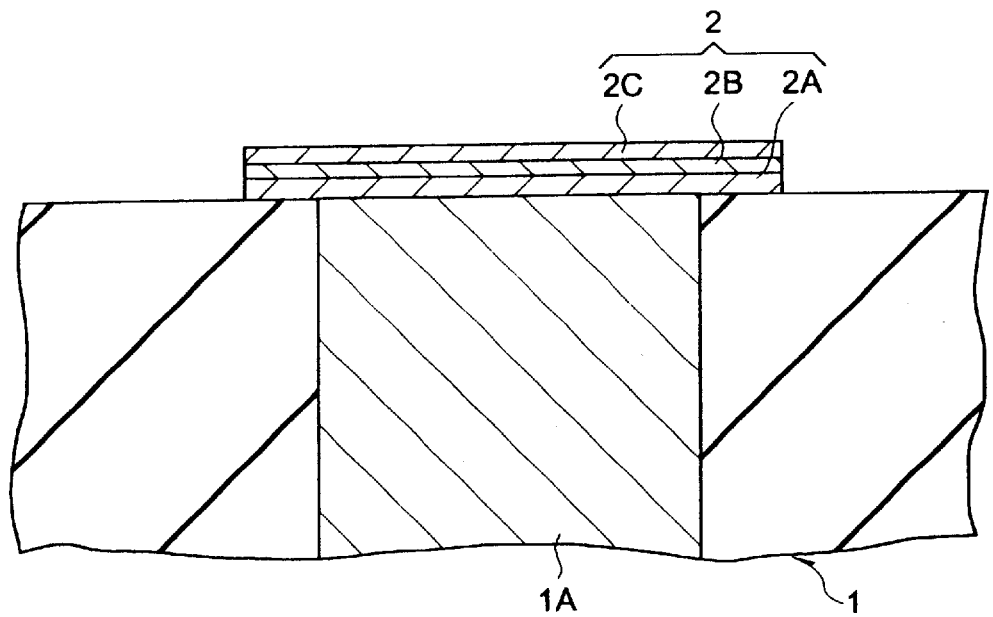
FIG. 2 is a cross sectional view of an important part of a circuit board in the step before the production process of the semiconductor device is conducted.

The electrode pad 2 is formed on a conductor 1A embedded in a contact hole of the circuit board 1 as shown in FIG. 2 (a cross sectional view of an important part of the circuit board in the step before the production process of the semiconductor device is conducted). While the electrode pad 2 is not limited to this structure, it is constituted with a laminated structure, in which a nickel (Ni) film 2A, a nickel film 2B and a gold (Au) film 2C are accumulated in this order from the side of the chip-mounting surface of the circuit board 1. Boron (B) is added to the nickel film 2A, and phosphorus (P) is added to the nickel film 2B. The nickel film 2A and the nickel film 2B have a high wettability with the bump electrode 7. That is, the electrode pad 2 is formed with a material having a good wettability with the bump electrode 7. While it will be described in detail later, the gold film 2C is diffused into the bump electrode 7 and absorbed thereto upon melt-connecting the bump electrode 7 to the electrode pad 2 in the production process of the semiconductor device.

Figure 3:
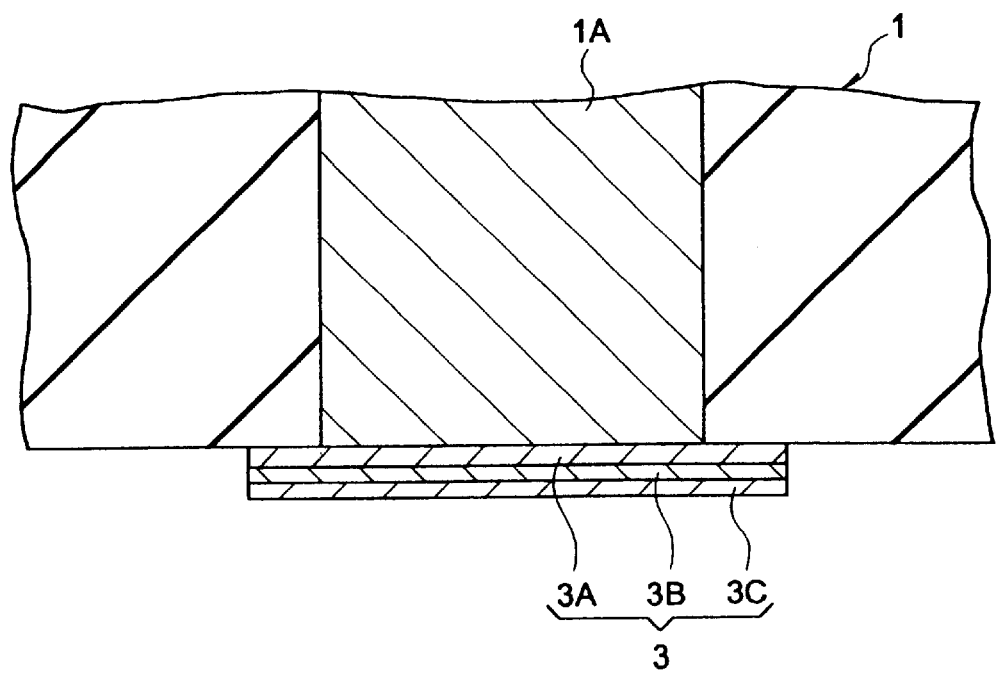
FIG. 3 is a cross sectional view of an important part of a circuit board in the step before the production process of the semiconductor device is conducted.

The electrode pad 3 is formed on a conductor 1A embedded in a contact hole of the circuit board 1 as shown in FIG. 3 (a cross sectional view of an important part of the circuit board in the step before the production process of the semiconductor device is conducted). While the electrode pad 3 is not limited to this structure, it is constituted with a laminated structure, in which a nickel (Ni) film 3A, a nickel film 3B and a gold (Au) film 3C are accumulated in this order from the side of the reverse surface of the circuit board 1. Boron (B) is added to the nickel film 3A, and phosphorus (P) is added to the nickel film 3B. The nickel film 3A and the nickel film 3B have a high wettability with the bump electrode 13. That is, the electrode pad 3 is formed with a material having a good wettability with the bump electrode 13. While it will be described in detail later, the gold film 3C is diffused into the bump electrode 13 and thereto upon forming the bump electrode 13 on the electrode pad 3 in the production process of the semiconductor device.

Figure 4:
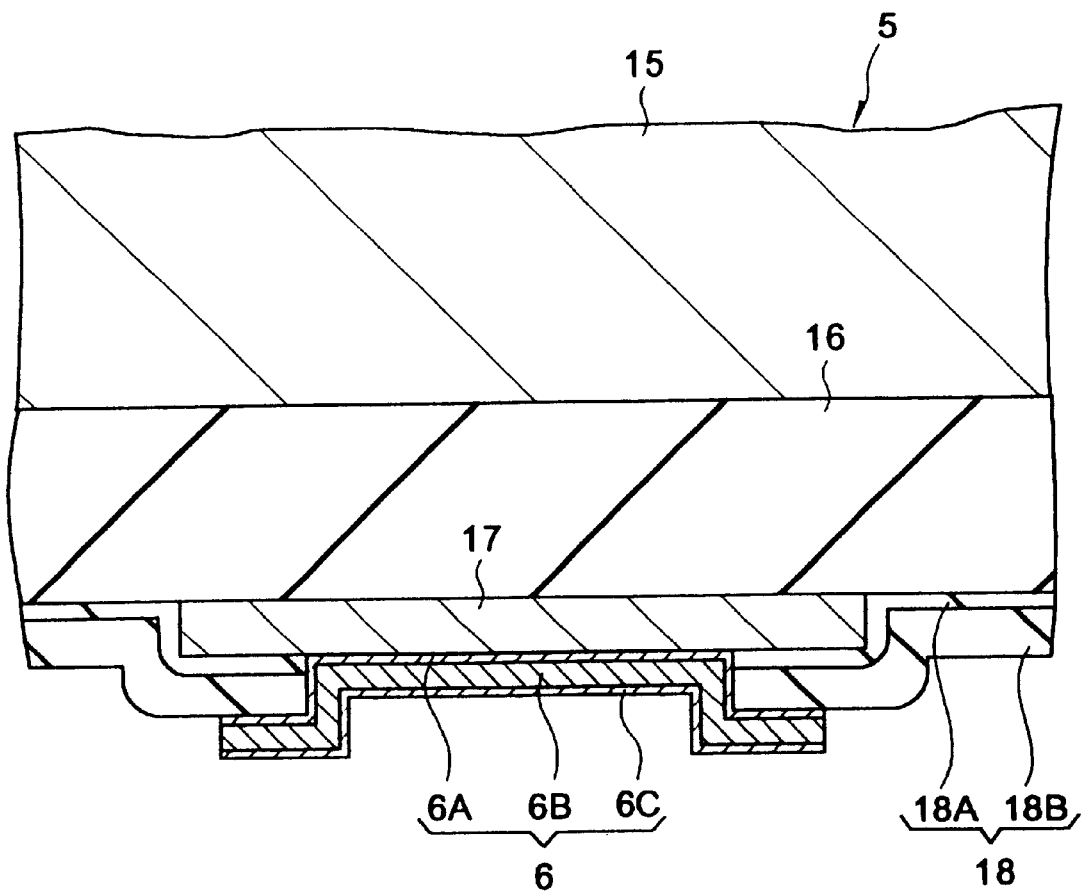
FIG. 4 is a cross sectional view of an important part of a semiconductor chip in the step before the production process of the semiconductor device is conducted.

The electrode pad 6 is electrically and mechanically connected to the electrode pad 17 as a lower layer through an opening formed in a final protective film 18 of the semiconductor chip 5 as shown in FIG. 4 (a cross sectional view of an important part of the semiconductor chip in the step before the production process of the semiconductor device is conducted). While not shown in detail in the figure, the electrode pad 17 is formed on the uppermost wiring layer among the wiring layers formed on a semiconductor substrate 15, and is formed, for example, with an aluminum (Al) film or an aluminum alloy film. The electrode pad 17 is separated and insulated from the semiconductor substrate 15 by an interlevel dielectric layer 16. The final protective film 18 is constituted, for example, with a laminated structure comprising a silicon nitride film 18A and a silicon oxide film 18B accumulated in this order.

While the electrode pad 6 is not limited to this structure, it is constituted, for example, with a laminated structure, in which a chromium (Cr) film 6A, a nickel film 6B and a gold film 6C are accumulated in this order from the side of the surface of the electrode pad 17. The chromium film 6A has a high adhesive property to the final protective film 18, and the nickel film 6B has a high wettability with the bump electrode 7. That is, the electrode pad 6 is formed with a material having a good wettability with the bump electrode 7. While it will be described in detail later, the gold film 6C is diffused into the bump electrode 7 and absorbed thereto upon forming the bump electrode 7 on the electrode pad 6 in the production process of the semiconductor device.

Figure 5:
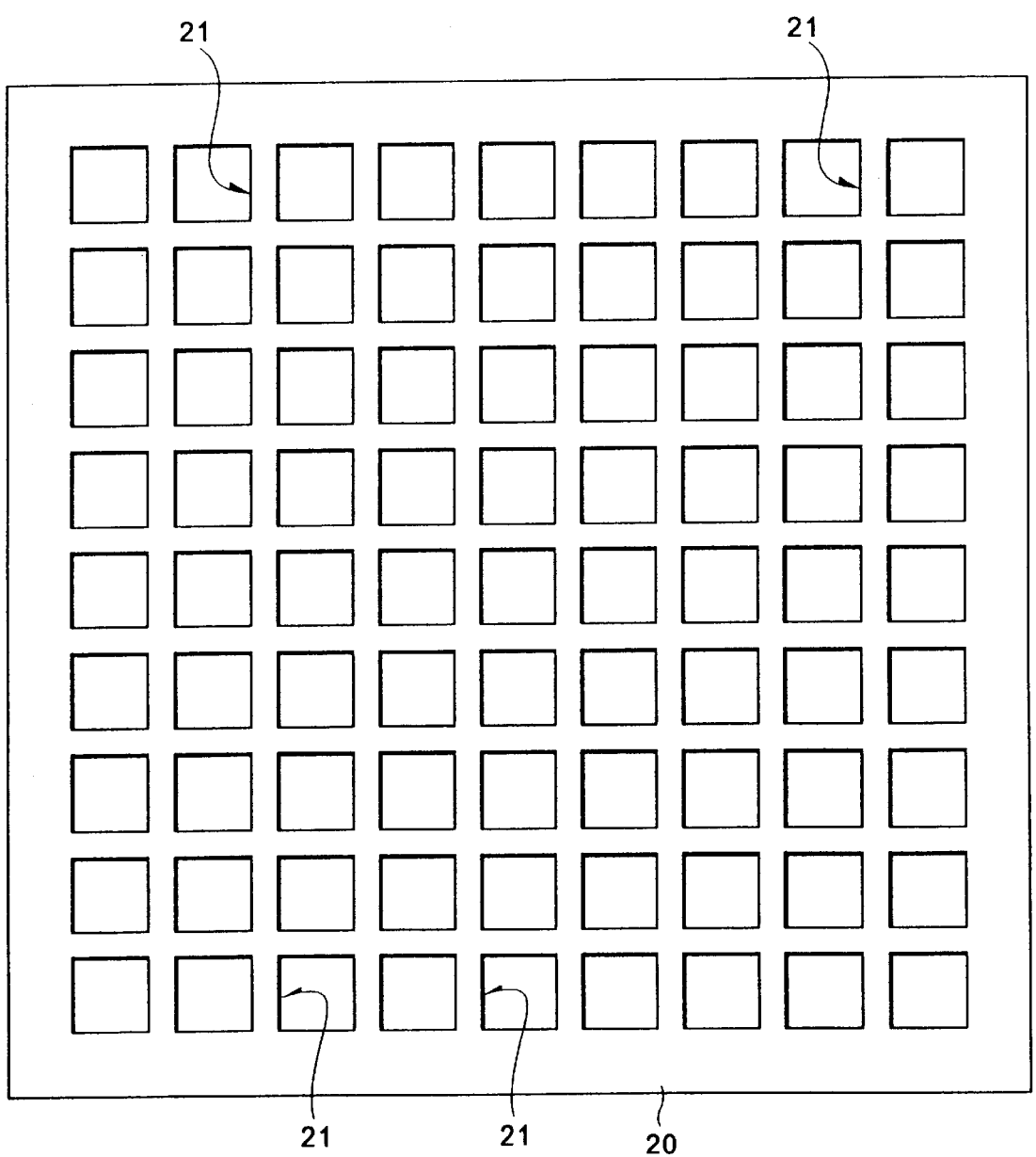
FIG. 5 is a plan view of a jig for forming bumps.

The bump electrode 13 is formed, in the production process of the semiconductor device, by the forming method using a jig for forming bumps 20 shown in FIG. 5 (a plan view of a jig for forming bumps).

The jig for forming bumps 20 is formed with a material having a poor wettability with the bump electrode 13, such as a glass material. The plan shape of the jig for forming bumps 20 is the same as the plan shape of the circuit board 1, i.e., the square shape in this embodiment. The jig for forming bumps 20 has one flat surface, and plural concave parts 21 arranged in a matrix form are formed on the surface. The concave parts 21 are arranged at the same arrangement interval as the arrangement interval of the electrode pads 3 provided on the reverse surface of the circuit board 1. That is, the arrangement interval of the concave parts 21 is set at 300 $\mu$m in this embodiment.

Figure 6:
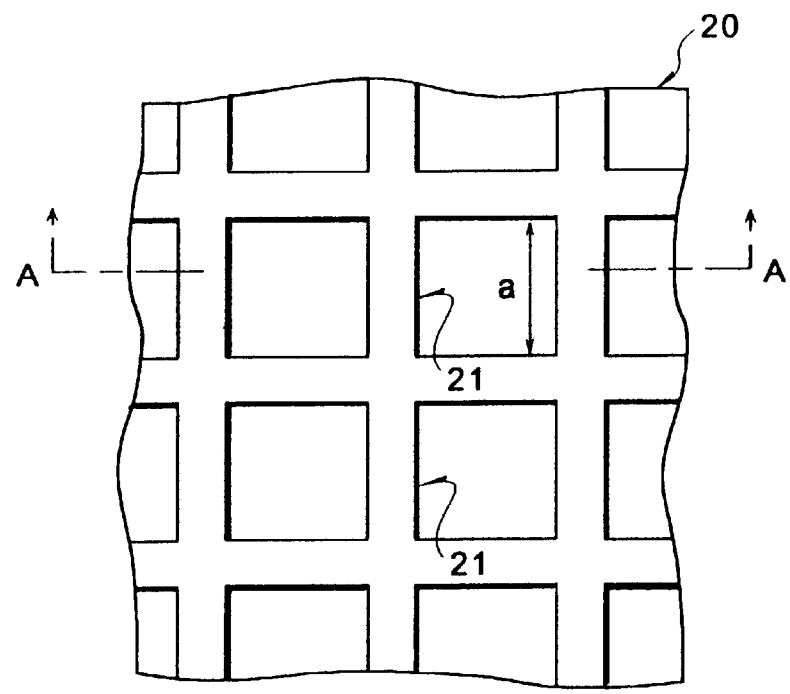
FIG. 6 is an enlarged plan view of an important part of the jig for forming bumps.
Figure 7:
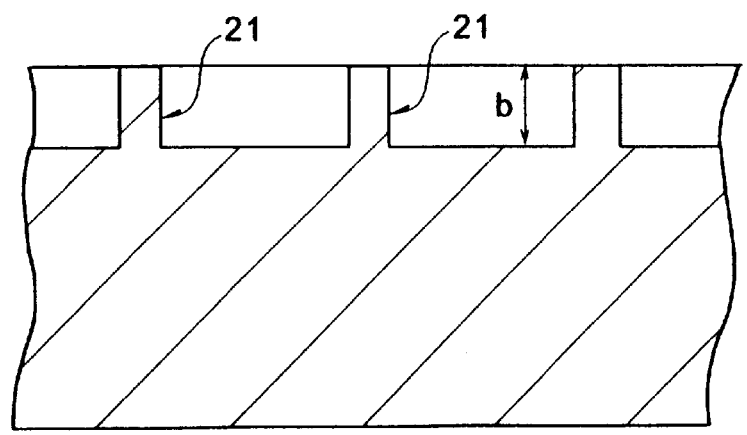
FIG. 7 is a cross sectional view on the line A—A in FIG. 6.

While the plan shape of the concave part 21 is not limited to the figure, it is, for example, of a square shape as shown in FIG. 5 and FIG. 6 (an enlarged plan view of an important part of FIG. 5), and the length a of one edge thereof is set at about 225 $\mu$m. While the cross sectional shape of the concave part 21 in the depth direction is not limited to the figure, it is, for example, of a rectangular shape as shown in FIG. 7 (a cross sectional view on the line A—A in FIG. 6.), and the depth b thereof is set at about 110 $\mu$m. That is, the depth b of the concave part 21 is set at a dimension that is about a half of the plan edge a.

The jig for forming bumps 20 is formed in such a manner that an etching mask having a prescribed pattern is formed on one surface of a member comprising a glass material by a photolithography technique, and thereafter etching is conducted on the member exposed from the etching mask to form the concave parts 21.

The production process of the semiconductor device will be described with reference to FIGS. 8 to 18 (cross sectional views for describing the production process), and at the same time, the method for manufacturing the bump electrodes 13 and the bump electrodes 7 will be described.

Figure 8:
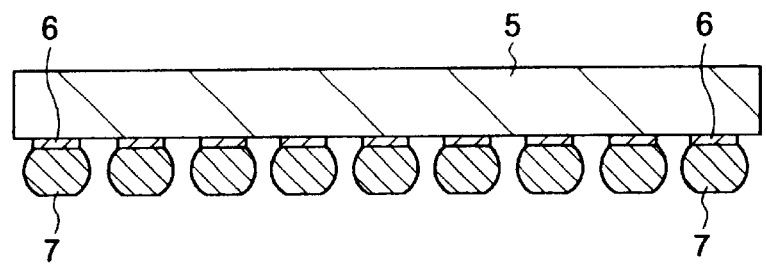
FIG. 8 is a cross sectional view for describing the production process of the semiconductor device.

Firstly, a semiconductor chip 5 shown in FIG. 8 is prepared. Plural electrode pads 6 are provided on a circuit-forming surface (one surface) of the semiconductor chip 5, and bump electrodes 7 are formed on the surfaces of the plural electrode pads 6. The bump electrode 7 has a spherical shape, the tips of which collapse. The method for manufacturing the bump electrodes 7 will be described later.

Figure 9:
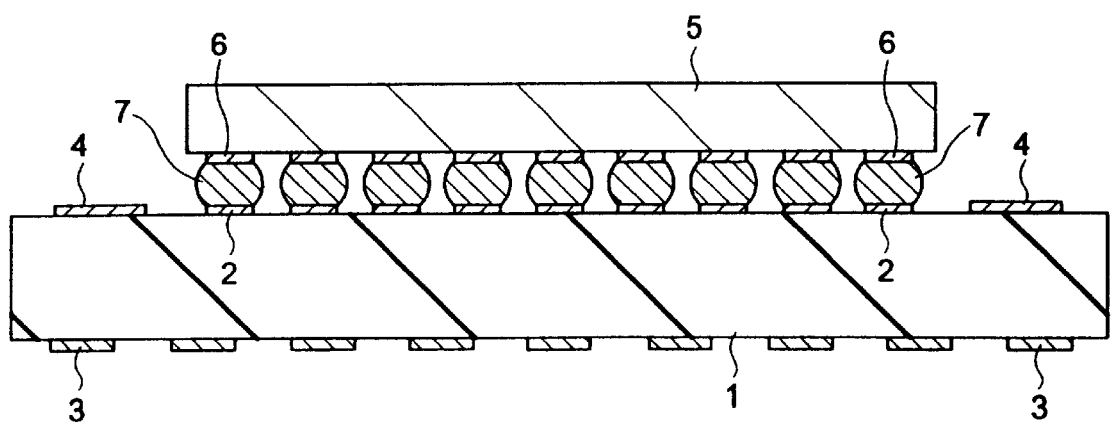
FIG. 9 is a cross sectional view for describing the production process of the semiconductor device.

As shown in FIG. 9, the semiconductor chip 5 is mounted on a chip-mounting surface of a circuit board 1. The mounting of the semiconductor chip 5 is conducted in such a manner that a flux is formed on the surface of electrode pads 2 provided on the chip-mounting surface of the circuit board 1, and then the bump electrodes 7 are melt-connected to the surfaces of the electrode pads 2. The melting of the bump electrodes 7 is conducted in a nitrogen ($N_2$) gas atmosphere under the temperature condition of 345° C. In this step, the gold film 2C of the electrode pad 2 shown in FIG. 2 is diffused into the bump electrode 7 and absorbed thereto.

A washing treatment is then conducted to remove the flux remaining on the chip-mounting surface of the circuit board 1.

Figure 10:
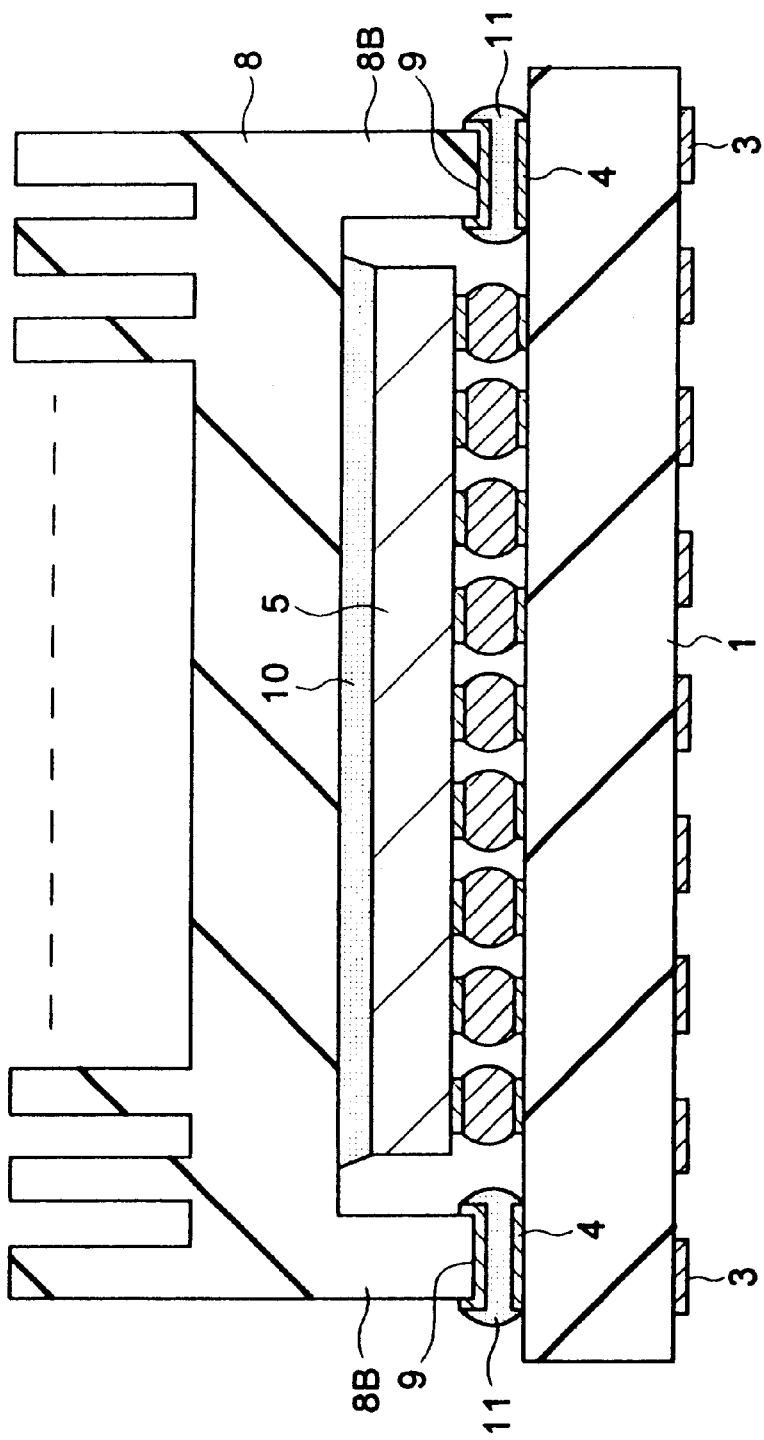
FIG. 10 is a cross sectional view for describing the production process of the semiconductor device.

As shown in FIG. 10, the semiconductor chip 5 is sealed with a sealing cap 8, and at the same time, the reverse surface of the semiconductor chip 5 and the inner wall surface of the sealing cap 8 are connected through a heat conductive material 10. The sealing of the semiconductor chip 5 is conducted in such a manner that a sealing material 11 is inserted between a metallized layer 4 provided on the chip-mounting surface of the circuit board 1 and a metallized layer 9 provided on leg parts 8B of the sealing cap 8, and the sealing material 11 is then melted. The connection of the reverse surface of the semiconductor chip 5 and the inner wall surface of the sealing cap 8 is conducted in such a manner that the heat conductive material 10 is interposed between the reverse surface of the semiconductor chip 5 and the inner wall surface of the sealing cap 8, and the heat conductive material 10 is then melted. The melting of the sealing material 11 and the heat conductive material 10 is conducted in a mixed gas atmosphere of a nitrogen gas and a hydrogen ($H_2$) gas under a temperature condition of 310° C.

A jig for forming bumps 20 shown in FIG. 5 is then prepared. On one surface of the jig for forming bumps 20, plural concave parts 21 are provided that are arranged at the same arrangement interval as the arrangement interval of electrode pads 3 provided on the reverse surface (one surface) of the circuit board 1.

Figure 11:
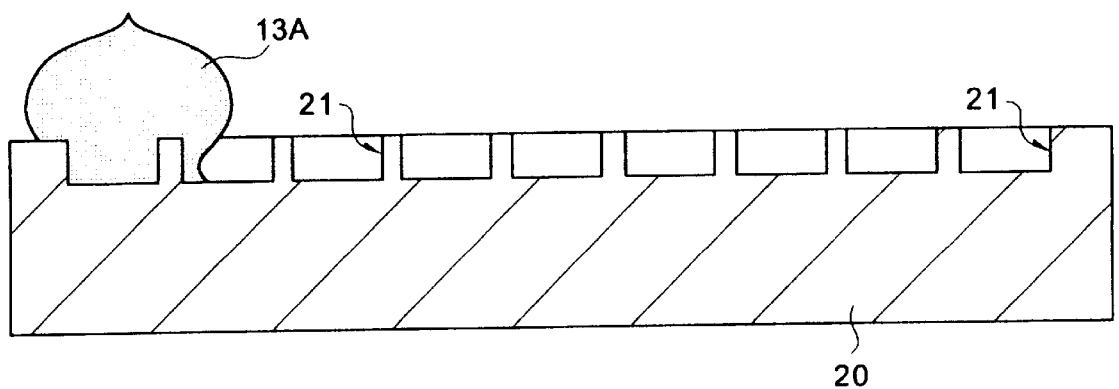
FIG. 11 is a cross sectional view for describing the production process of the semiconductor device.

As shown in FIG. 11, a solder paste material 13A in a semi-solid state is coated on one surface of the jig for forming bumps 20. As the solder paste material 13A, a solder paste material obtained by kneading at least fine solder particles and a flux is used. The solder paste material 13A in this embodiment has the solder particles having a composition comprising 97% by weight of Sn and 3% by weight of Ag, the particle diameter of the solder particles is set at 30 μm, and the content of the solder particles is set at about 46%. The flux contains colophonium, an activating agent, an organic solvent and the like.

Figure 12:
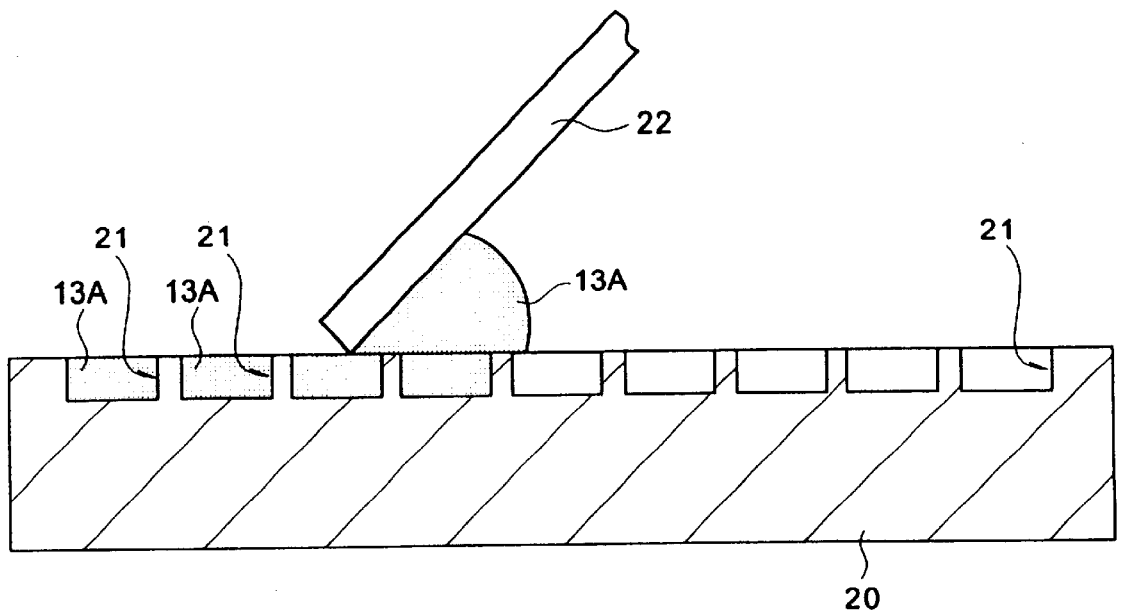
FIG. 12 is a cross sectional view for describing the production process of the semiconductor device.

As shown in FIG. 12, a squeegee 22 is slid along the one surface of the jig for forming bumps 20 to fill the solder paste material 13A into the concave parts 21 of the jig for forming bumps 20, and at the same time, excessive solder paste material 13A is removed. The sliding of the squeegee 22 is repeated for several times. In this step, because the depth b of the concave part 21 is set at a dimension that is about a half of the plan edge a thereof, the solder paste material 13A can be uniformly filled without filling failure in the concave part 21. As the squeegee 22, a squeegee comprises a urethane material, a metallic material, such as stainless steel, or a ceramic material.

Figure 13:
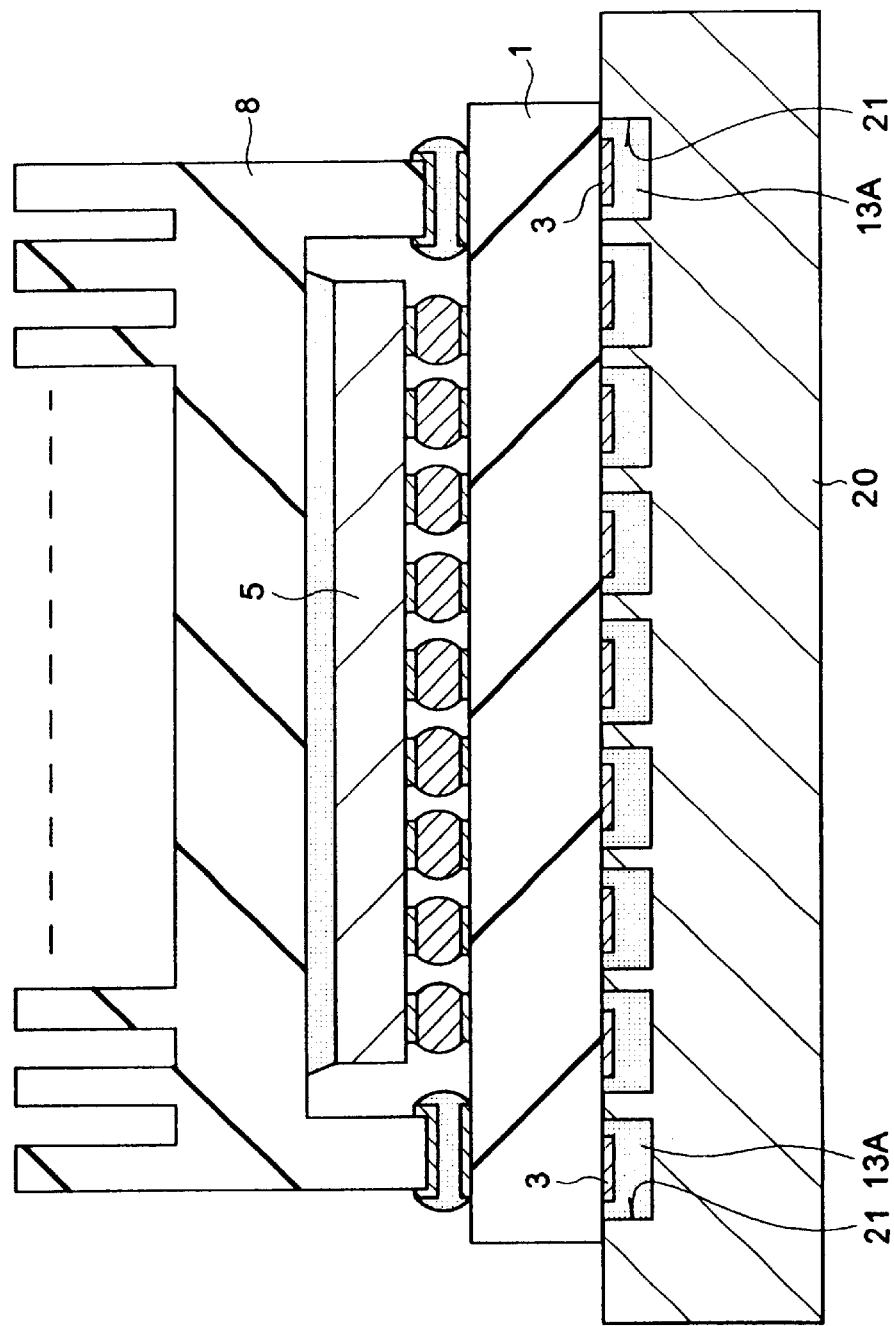
FIG. 13 is a cross sectional view for describing the production process of the semiconductor device.

As shown in FIG. 13, the circuit board 1 is then mounted on the one surface of the jig for forming bumps 20 under the condition in that the concave parts 21 provided on the one surface of the jig for forming bumps 20 are made to face the electrode pads 3 provided on the reverse surface (one surface) of the circuit board 1, and the electrode pads 3 of the circuit board 1 are made in contact with the solder paste material 13A filled in the concave parts 21.

Figure 14:
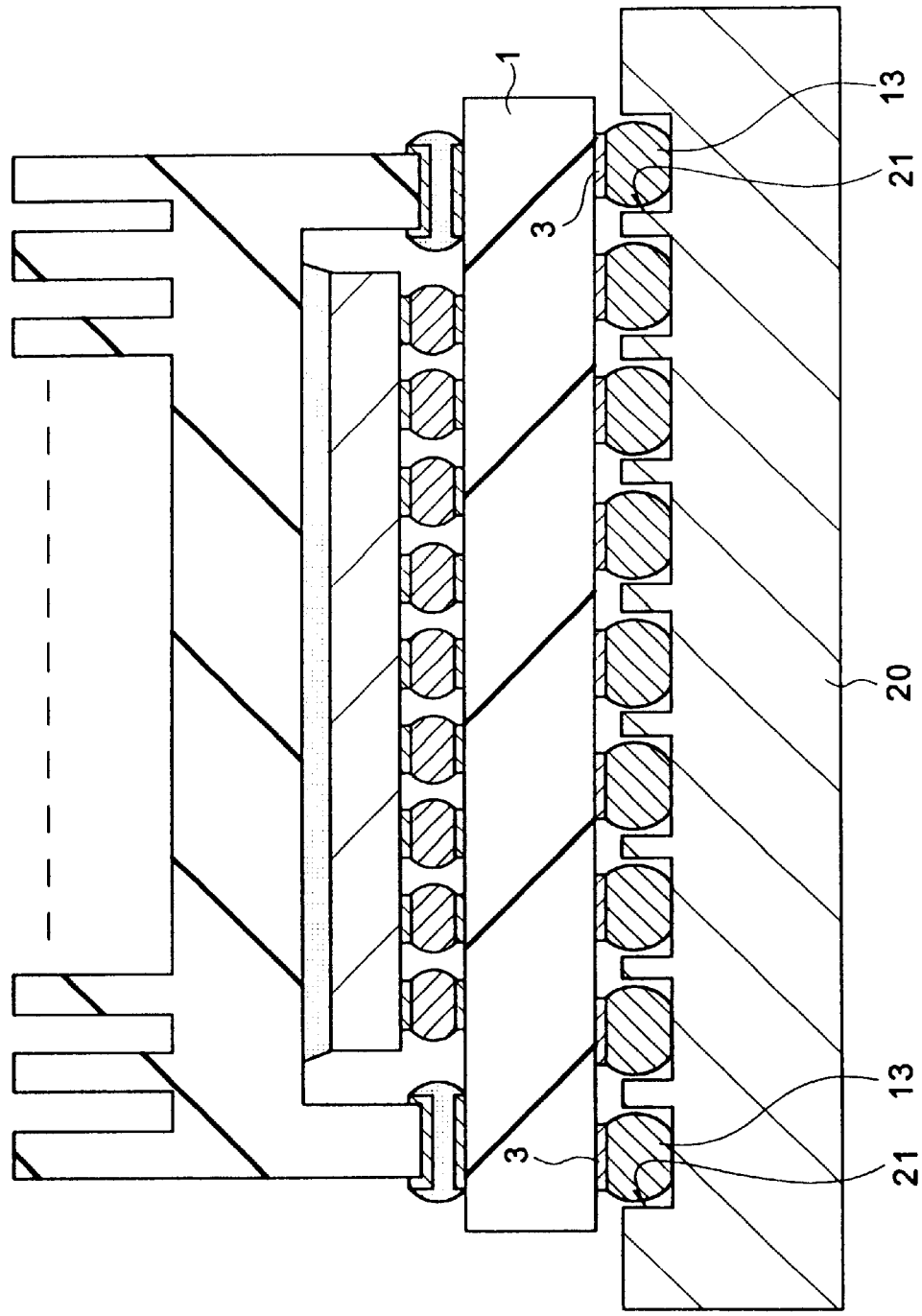
FIG. 14 is a cross sectional view for describing the production process of the semiconductor device.

Under the condition described above, the solder paste material 13A is then melted to form bump electrodes 13 on the electrode pads 3 of the circuit board 1 as shown in FIG. 14. The melting of the solder paste material 13A is conducted in a nitrogen ($N_2$) gas atmosphere under the temperature condition of 240° C. In this step, the molten solder paste material 13A becomes a spherical body by the surface tension, and the circuit board 1 is pushed upward by the surface tension to form a gap between the jig for forming bumps 20 and the circuit board 1. In this step, furthermore, because the solder paste material 13A filled in the concave parts 21 of the jig for forming bumps 20 is melted to form the bump electrodes 13 on the electrode pads 3 of the circuit board 1, the amount of the solder paste material 13A can be constant, and the size of the bump electrodes 13 formed on the electrode pads 3 of the circuit board 1 can be uniform. In this step, furthermore, because the solder paste material 13A filled in the concave parts 21 of the jig for forming bumps 20 does not leak between the jig for forming bumps 20 and the circuit board 1, an electrically conductive foreign matter formed with the leaking excessive solder paste material can be eliminated, and thus a short circuit among the electrode pads 3 of the circuit board 1 can be prevented. In this step, furthermore, the gold film 3C of the electrode pad 3 shown in FIG. 3 is diffused into the bump electrode 13 and absorbed thereto.

A washing treatment is then conducted to remove the flux remaining on the surface of the jig for forming bumps 20. In this step, because a gap is formed between the one surface of the jig for forming bumps 20 and the reverse surface of the circuit board 1, a washing liquid can be uniformly supplied to the respective concave parts 21, and the flux can be easily removed.

The circuit board 1 is then removed from the jig for forming bumps 20 to substantially complete the semiconductor device shown in FIG. 1.

A method for manufacturing the bump electrode 7 will be described.

Figure 15:
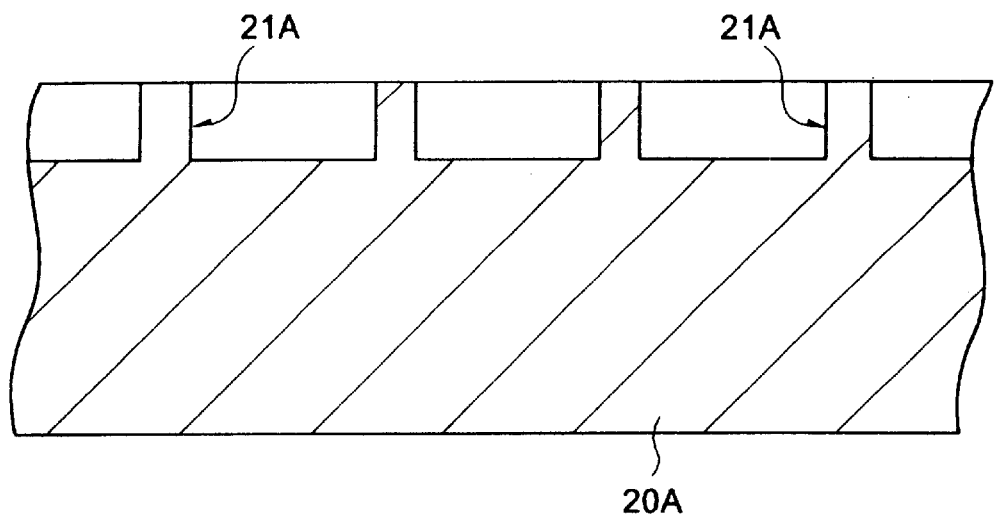
FIG. 15 is a cross sectional view of an important part for describing the production process of the semiconductor device.

Firstly, a jig for forming bumps 20A shown in FIG. 15 is prepared. Plural concave parts 21A arranged at the same arrangement interval as the arrangement interval of plural electrode pads 6 provided on a circuit-forming surface (one surface) of the semiconductor chip 5 are provided on one surface of the jig for forming bumps 20A. The plan shape of the concave part 21A is, for example, of a square shape, and the cross sectional shape in the depth direction thereof is, for example, of a rectangular shape. The depth of the concave part 21A is set at a dimension that is about a half of the plan edge thereof, as similar to the concave part 21.

Figure 16:
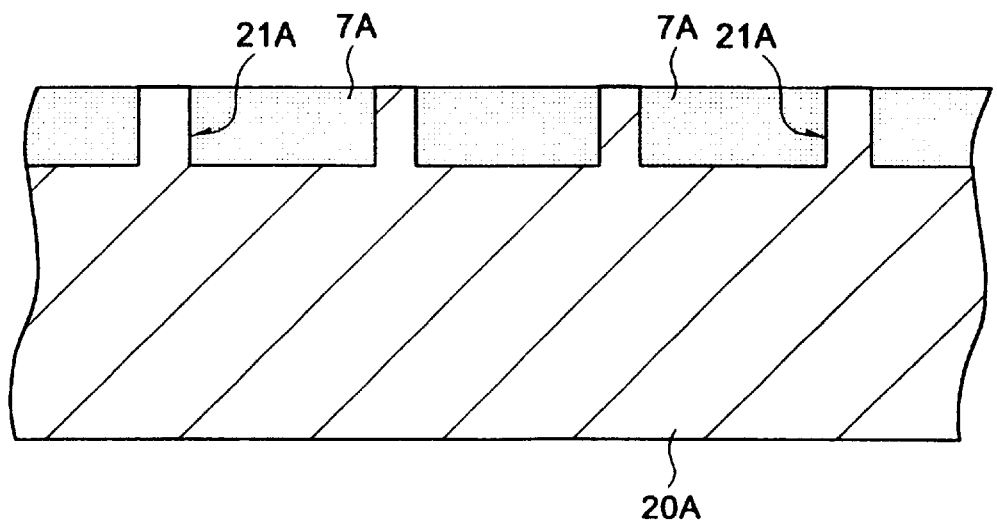
FIG. 16 is a cross sectional view of an important part for describing the production process of the semiconductor device.

As shown in FIG. 16, a solder paste material 7A in a semi-solid state is then filled in the jig for forming bumps 20A. The filling of the solder paste material 7A is conducted in the same manner as the filling of the solder paste material 13A. As the solder paste material 7A, a solder paste material obtained by kneading at least fine solder particles and a flux is used in the solder paste material 7A in this embodiment, the solder particles have a composition comprising 98.2% by weight of Pb and 1.8% by weight of Sn, the particle diameter of the solder particles is set at from 10 to 30 μm, and the content of the solder particles is set at about from 30 to 60%. The flux contains colophonium, an activating agent, an organic solvent and the like.

Figure 17:
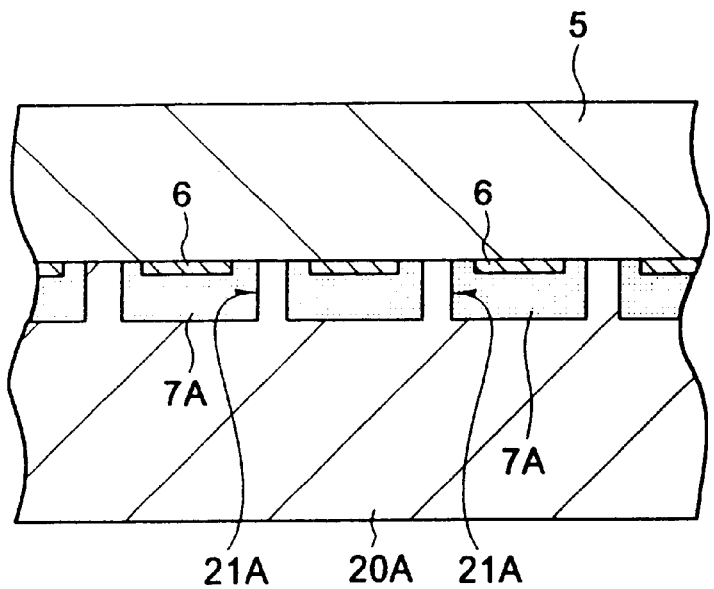
FIG. 17 is a cross sectional view of an important part for describing the production process of the semiconductor device.

As shown in FIG. 17, the semiconductor chip 5 is then mounted on the one surface of the jig for forming bumps 20A under the condition in that the concave parts 21A provided on the one surface of the jig for forming bumps 20A are made to face the electrode pads 6 provided on the circuit-forming surface (one surface) of the semiconductor chip 5, and the electrode pads 6 of the semiconductor chip 5 are made in contact with the solder paste material 7A filled in the concave parts 21A.

Figure 18:
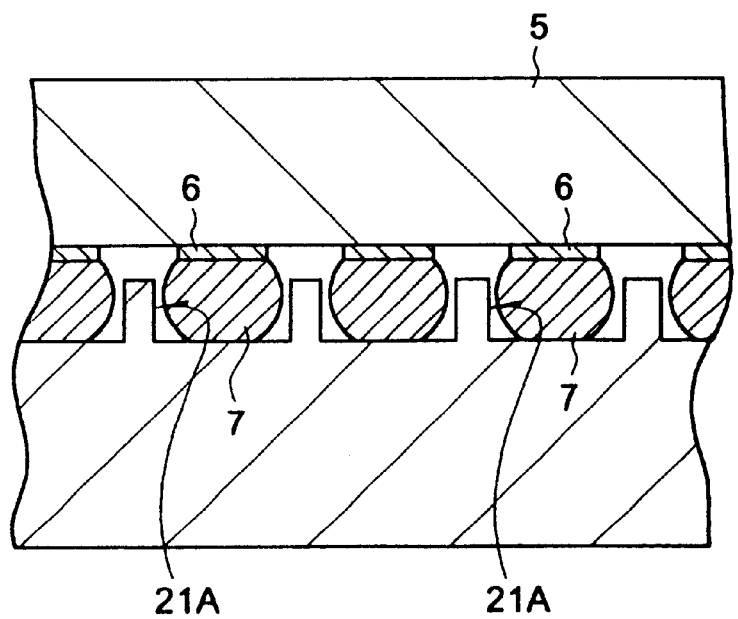
FIG. 18 is a cross sectional view of an important part for describing the production process of the semiconductor device.

Under the condition described above, the solder paste material 7A is melted to form the bump electrodes 7 on the electrode pads 6 of the semiconductor chip 5 as shown in FIG. 18. The melting of the solder paste material 7A is conducted in a nitrogen ($N_2$) gas atmosphere under the temperature condition of 350° C. In this step, the molten solder paste material 7A becomes a spherical body by the surface tension, and the semiconductor chip 5 is pushed upward by the surface tension to form a gap between the jig for forming bumps 20A and the semiconductor chip 5. In this step, furthermore, because the solder paste material 7A filled in the concave parts 21A of the jig for forming bumps 20A is melted to form the bump electrodes 7 on the electrode pads 6 of the semiconductor chip 5, the amount of the solder paste material 7A can be constant, and the size of the bump electrodes 7 formed on the electrode pads 6 of the semiconductor chip 5 can be uniform. In this step, furthermore, because the solder paste material 7A filled in the concave parts 21A of the jig for forming bumps 20A does not leak between the jig for forming bumps 20A and the semiconductor chip 5, an electrically conductive foreign matter formed with the leaking excessive solder paste material can be eliminated, and thus a short circuit among the electrode pads 3 of the semiconductor chip 5 can be prevented. In this step, furthermore, the gold film 6C of the electrode pad 6 shown in FIG. 4 is diffused into the bump electrode 7 and absorbed thereto.

A washing treatment is then conducted to remove the flux remaining on the surface of the jig for forming bumps 20A. In this step, because a gap is formed between the one surface of the jig for forming bumps 20A and the circuit-forming surface of the semiconductor chip 5, a washing liquid can be uniformly supplied to the respective concave parts 21A, and the flux can be easily removed.

The semiconductor chip 5 is then removed from the jig for forming bumps 20A to form the semiconductor chip 5 having the bump electrodes 7 as shown in FIG. 8.

Figure 19:
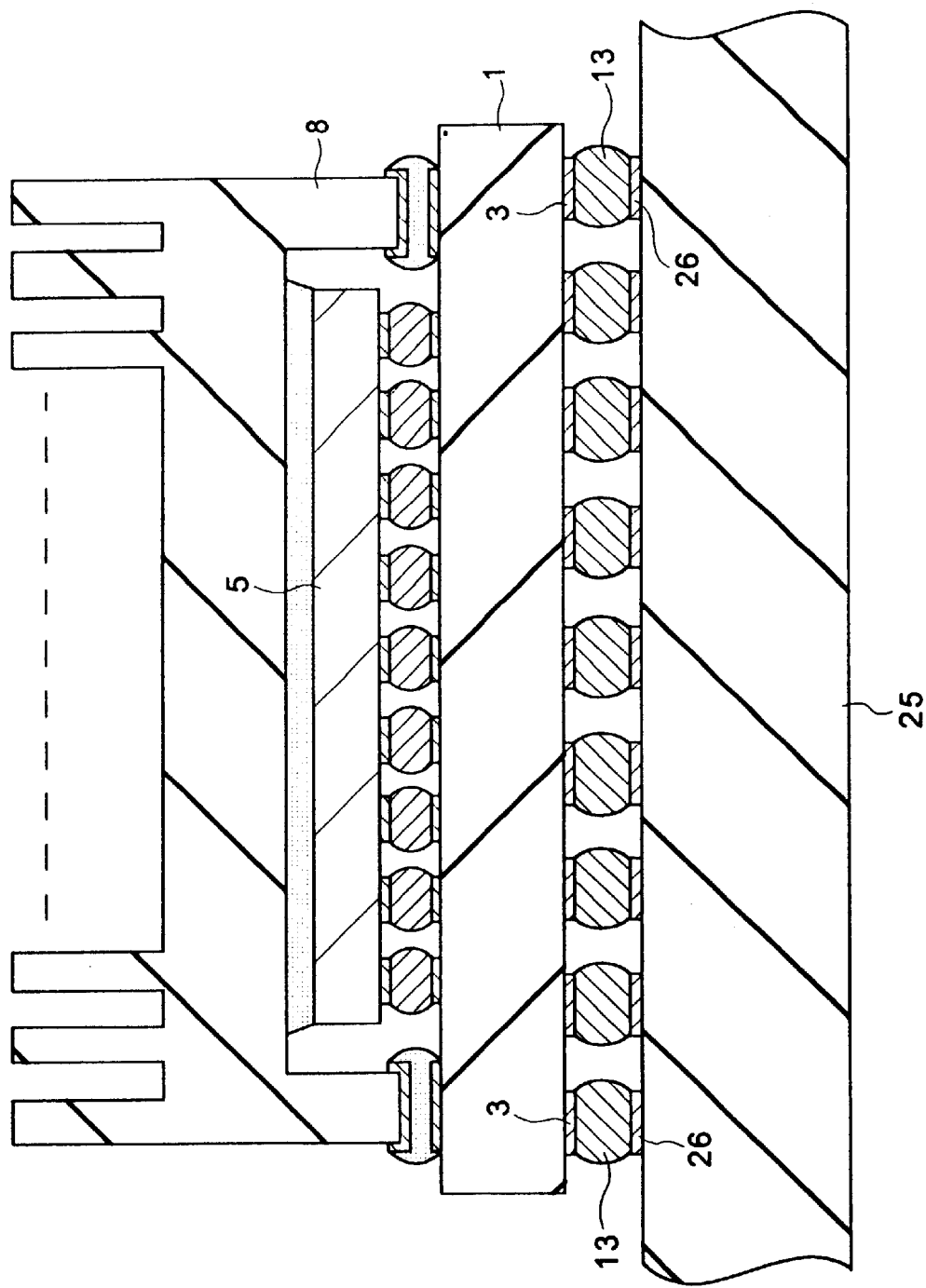
FIG. 19 is a cross sectional view of an important part showing the state in that the semiconductor device is mounted on a package substrate.

The semiconductor device thus constituted is mounted on the mounting surface of a package substrate 25 as shown in FIG. 19, and installed in an operation processing part of a large scale computer. The packaging of the semiconductor device is conducted by melt-connecting the bump electrodes 13 to electrode pads 26 provided on the mounting surface of the package substrate 25.

Accordingly, the following effects can be obtained by this embodiment:

(1) In the method of manufacturing the bump electrodes 13, the solder paste material 13A is filled in the concave parts 21 provided on one surface of the jig for forming bumps 20; the concave parts 21 of the jig for forming bumps 20 are made to face the electrode pads 3 provided on one surface of the circuit board (substrate) 1; and the solder paste material 13A is melted under the condition in that the electrode pads 3 of the circuit board 1 are in contact with the solder paste material 13A, so as to form the bump electrodes 13 on the electrode pads 3 of the circuit board 1.

According to this manner, because the solder paste material 13A filled in the concave parts 21 of the jig for forming bumps 20 is melted to form the bump electrodes 13 on the electrode pads 3 of the circuit board 1, the amount of the solder paste material 13A can be constant, and thus the size of the bump electrodes 13 formed on the electrode pads 3 of the circuit board 1 can be uniform.

Furthermore, because the solder paste material 13A filled in the concave parts 21 of the jig for forming bumps 20 does not leak between the jig for forming bumps 20 and the circuit board 1, an electrically conductive foreign matter formed from the leaking excessive solder paste material can be eliminated, and a short circuit among the electrode pads 3 of the circuit board 1 can be prevented.

Furthermore, even when warp occurs in the circuit board 1, since the height of the bump electrodes 13 is changed corresponding to the warp of the circuit board 1, the height of the bump electrodes 13 with respect to the package substrate 25 can be uniform.

Furthermore, because the size of the bump electrodes 13 formed on the electrode pads 3 of the circuit board 1 can be uniform, contact failure between the electrode pads 26 of the package substrate 25 and the bump electrodes 13 on mounting the semiconductor device on the mounting surface of the package substrate 25 through the bump electrodes 13 can be prevented.

Furthermore, because a short circuit among the electrode pads 3 of the circuit board 1 can be prevented, the arrangement interval of the electrode pads 3 of the circuit board 1 can be narrow.

Furthermore, because there is no necessity to form flux on the electrode pads 3 of the circuit board 1, the formation steps of the bump electrodes 13 can be simplified to the extent corresponding thereto.

(2) In the method of manufacturing the bump electrodes 7, the solder paste material 7A is filled in the concave parts 21A provided on one surface of the jig for forming bumps 20A; the concave parts 21A of the jig for forming bumps 20A are made to face the electrode pads 6 provided on the circuit-forming surface (one surface) of the semiconductor chip (substrate) 5; and the solder paste material 7A is melted under the condition in that the electrode pads 6 of the semiconductor chip 5 are in contact with the solder paste material 7A, so as to form the bump electrodes 7 on the electrode pads 6 of the semiconductor chip 5.

According to this manner, because the solder paste material 7A filled in the concave parts 21A of the jig for forming bumps 20A is melted to form the bump electrodes 7 on the electrode pads 6 of the semiconductor chip 5, the amount of the solder paste material 7A can be constant, and thus the size of the bump electrodes 7 formed on the electrode pads 6 of the semiconductor chip 5 can be uniform.

Furthermore, because the solder paste material 7A filled in the concave parts 21A of the jig for forming bumps 20A does not leak between the jig for forming bumps 20A and the semiconductor chip 5, an electrically conductive foreign matter formed from the leaking excessive solder paste material can be eliminated, and a short circuit among the electrode pads 3 of the semiconductor chip 5 can be prevented.

Furthermore, even when warp occurs in the semiconductor chip 5, since the height of the bump electrodes 7 is changed corresponding to the warp of the semiconductor chip 5, the height of the bump electrodes 7 with respect to the circuit board 1 can be uniform.

Furthermore, because the size of the bump electrodes 7 formed on the electrode pads 6 of the semiconductor chip 5 can be uniform, contact failure between the electrode pads 2 of the circuit board 1 and the bump electrodes 7 on mounting the semiconductor chip 5 on the chip-mounting surface of the circuit board 1 through the bump electrodes 7 can be prevented.

Furthermore, because a short circuit among the electrode pads 6 of the semiconductor chip 5 can be prevented, the arrangement interval of the electrode pads 5 of the semiconductor chip 5 can be narrow.

Furthermore, because there is no necessity to form flux on the electrode pads 6 of the semiconductor chip 5, the formation steps of the bump electrodes 7 can be simplified to the extent corresponding thereto.

While this embodiment describes an example, in which in the formation process of the bump electrodes 13, the solder paste material 13A is melted under the condition in that the electrode pads 3 of the circuit board 1 are in contact with the solder paste material 13A, so as to form the bump electrodes 13 on the electrode pads 3 of the circuit board 1, the electrode pads 3 of the circuit board 1 may not necessarily be in contact with the solder paste material 13A.

While this embodiment describes an example, in which in the formation process of the bump electrodes 7, the solder paste material 7A is melted under the condition in that the electrode pads 6 of the semiconductor chip 5 are in contact with the solder paste material 7A, so as to form the bump electrodes 7 on the electrode pads 6 of the semiconductor chip 5, the electrode pads 6.of the semiconductor chip 5 may not necessarily be in contact with the solder paste material 7A.

While the embodiment describes an example, in which the bump electrodes 7 are formed on the electrode pads 6 of the semiconductor chip 5, the bump electrodes 7 may be formed on the electrode pads 2 of the circuit board 1.

While the invention made by the present inventors has been specifically described based on the embodiment, the invention is not limited to the embodiment, but it goes without saying that various changes can be made unless it deviates from the gist thereof.

Figure 20:
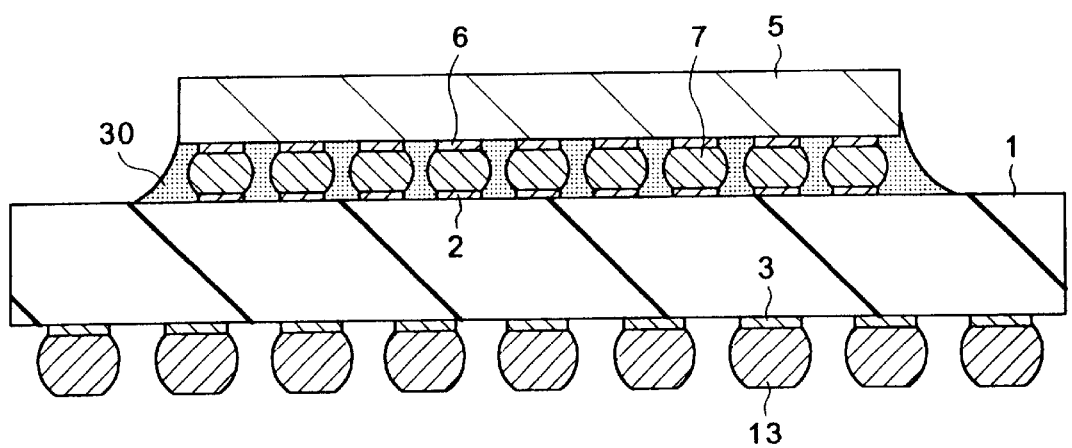
FIG. 20 is a cross sectional view of a semiconductor device, to which the invention is applied.

For example, the invention can be applied to a semiconductor device having a BGA (ball grid array) structure shown in FIG. 20 (a cross sectional view). The semiconductor device has a structure, in which a semiconductor chip 5 is mounted on a chip-mounting surface of a circuit board 1 through bump electrodes 7, an insulating resin 30 is filled in a gap between the circuit board 1 and the semiconductor chip 5, and bump electrodes 13 are provided on the reverse surface of the circuit board 1.

Figure 21:
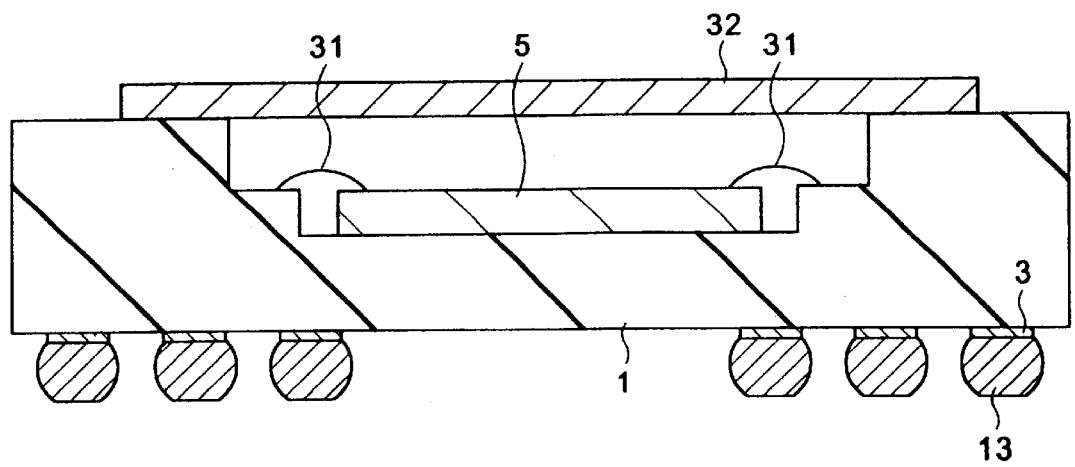
FIG. 21 is a cross sectional view of a semiconductor device, to which the invention is applied.

Furthermore, the invention can be applied to a semiconductor device having a BGA structure shown in FIG. 21 (a cross sectional view). The semiconductor device has a structure, in which a semiconductor chip 5 is mounted in a concave part of a circuit board 1, electrode pads of the circuit board 1 and electrode pads of the semiconductor chip 5 are electrically connected to each other with bonding wires 31, the semiconductor chip 5 is sealed with a cap 32, and bump electrodes 13 are provided on the reverse surface of the circuit board 1.

Figure 22:
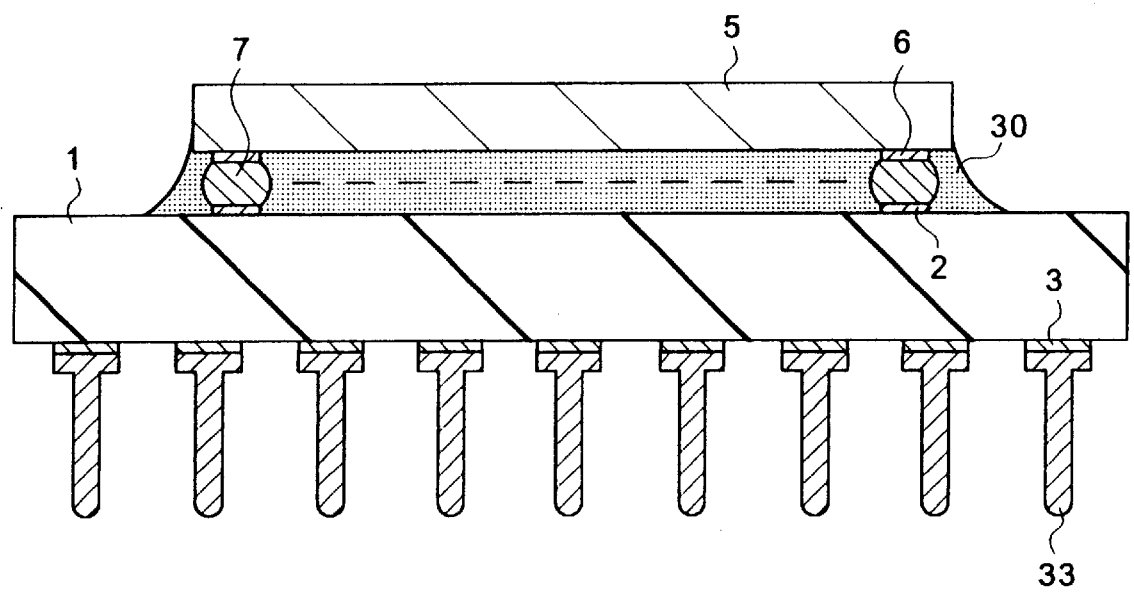
FIG. 22 is a cross sectional view of a semiconductor device, to which the invention is applied.

Furthermore, the invention can be applied to a semiconductor device having a PGA structure shown in FIG. 22 (a cross sectional view). The semiconductor device has a structure, in which a semiconductor chip 5 is mounted on a chip-mounting surface of a circuit board 1 through bump electrodes 7, an insulating resin 30 is filled in a gap between the circuit board 1 and the semiconductor chip 5, and lead pins 33 are provided on the reverse surface of the circuit board 1.

Figure 23:
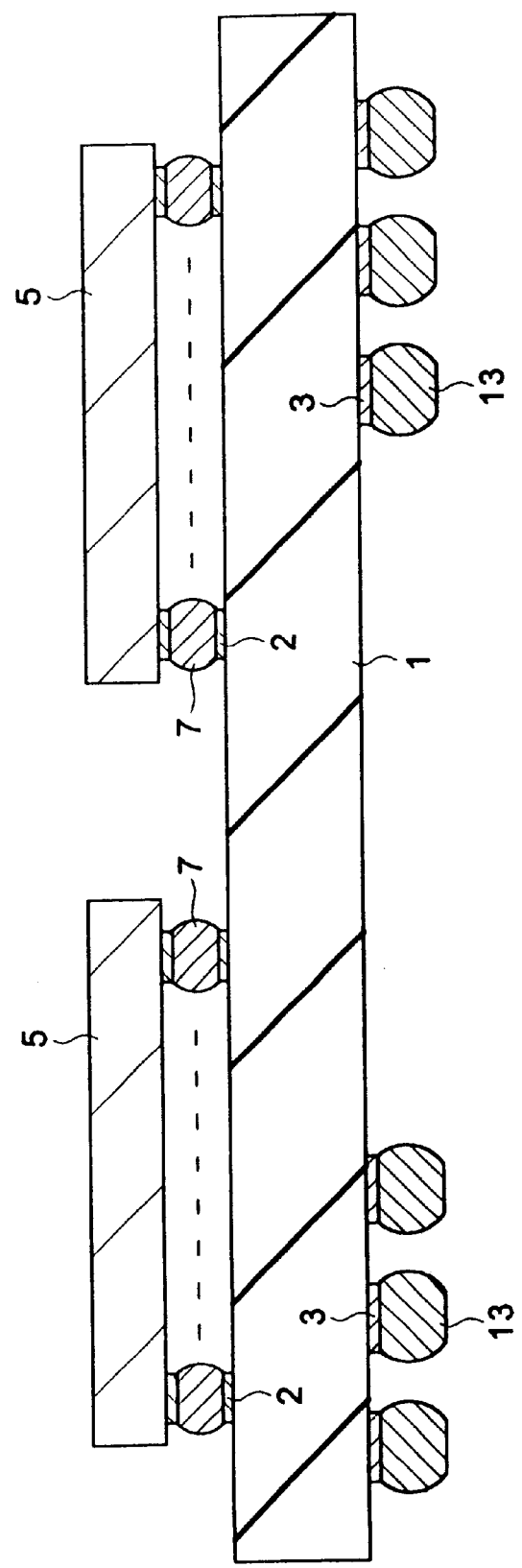
FIG. 23 is a cross sectional view of a semiconductor device, to which the invention is applied.

Furthermore, the invention can be applied to a semiconductor device having an MCM (micro chip module) structure shown in FIG. 23 (a cross sectional view). The semiconductor device has a structure, in which plural semiconductor chips 5 are mounted on a chip-mounting surface of a circuit board 1 through bump electrodes 7, and bump electrodes 13 are provided on the reverse surface of the circuit board 1.

Industrial Applicability

The size of bump electrodes formed on electrode pads can be uniform.

A short circuit among electrode pads of a substrate (a semiconductor chip or a circuit board) can be prevented.

The yield in a production process of a semiconductor device having bump electrodes can be increased.

What is claimed:

1. A method of manufacturing a semiconductor package having bump electrodes comprising the steps of:
    (a) providing a semiconductor chip having a plurality of semiconductor elements and terminal pads formed on a main surface thereof;
    (b) providing a jig for forming said bump electrodes and a substrate, said jig having concave parts provided on one surface thereof, each of concave parts being defined by an upper surface corresponding to said one surface, a bottom surface positioned at a relatively lower level than said upper surface and a side surface extending from said upper surface to said bottom surface, said substrate having electrode pads arranged on one surface thereof, each of said electrode pads having a size which is smaller than an opening of each of concave parts in a plane view;
    (c) mounting said semiconductor chip on said substrate such that said main surface of said semiconductor chip faces the opposing surface of said substrate;
    (d) filling said concave parts of said jig with a solder paste material;
    (e) disposing said substrate with said semiconductor chip on said jig in such a manner that said one surface of said substrate contacts said one surface of said jig; and
    (f) subjecting said solder paste material in said concave parts of said jig to a heat treatment and melting said solder paste material under the condition in that said electrode pads are embedded in said concave parts of said jig respectively and are in contact with said solder paste material, thereby to form bump electrodes on said electrode pads of said substrate and to form said semiconductor package to be mounted on a printed circuit board by said bump electrodes.

2. A method according to claim 1, further comprising a step of detaching said one surface of said substrate from said one surface of said jig by surface tension of said solder paste material in the step (f), thereby to form a space between said one surface of said substrate and said one surface of said jig in a thickness direction of said substrate.

3. A method according to claim 2, further comprising a step of cleaning a flux component included in said solder paste material by providing a cleaning fluid into said space between said one surface of substrate and said one surface of said jig.

4. A method according to claim 3, wherein each of concave parts of said jig has a square shape, and wherein a depth of each of said concave parts of said jig is set at a dimension that is about a half of a plane edge of each of said concave parts.

5. A method according to claim 4, wherein said depth of each of said concave parts of said jig is set at a dimension smaller than a height of said bump electrodes.

6. A method according to claim 5, wherein said jig is formed of a material having a wettability with said solder paste material lower than that of said substrate.

7. A method according to claim 6, wherein said jig is formed of glass.

* * * * *